United States Patent [19]
Wu et al.

[11] Patent Number: 5,349,565
[45] Date of Patent: Sep. 20, 1994

[54] SRAM WITH TRANSPARENT ADDRESS LATCH AND UNLATCHED CHIP ENABLE

[75] Inventors: Sheau-Dong Wu, Saratoga; Iu-Lin Lih, San Jose, both of Calif.

[73] Assignee: MOS Electronics Corporation, San Jose, Calif.

[21] Appl. No.: 755,319

[22] Filed: Sep. 5, 1991

[51] Int. Cl.$^5$ ............................................. G11C 11/34
[52] U.S. Cl. ..................... 365/230.08; 365/189.05; 365/230.03
[58] Field of Search ................ 365/230.08, 189.05, 365/230.03, 233

[56] References Cited

U.S. PATENT DOCUMENTS

| | | | |
|---|---|---|---|
| 4,408,305 | 10/1983 | Kuo .................... | 365/230.03 |
| 4,451,745 | 5/1984 | Itoh et al. ............ | 365/230.08 |
| 4,494,222 | 2/1985 | White et al. .......... | 365/230.08 |
| 4,566,082 | 2/1986 | Anderson ............. | 365/230.03 |
| 4,811,303 | 3/1989 | Hirai .................. | 365/230.08 |
| 4,907,203 | 3/1990 | Wada et al. .......... | 365/230.03 |
| 4,939,692 | 7/1990 | Kendall .............. | 365/230.08 |
| 5,083,296 | 1/1992 | Hara et al. .......... | 365/230.02 |

FOREIGN PATENT DOCUMENTS

| | | | |
|---|---|---|---|
| 48206 | 6/1982 | Japan ............... | 365/230.08 |

*Primary Examiner*—Eugener R. LaRoche
*Assistant Examiner*—Vu Le
*Attorney, Agent, or Firm*—Claude A. S. Hamrick

[57] ABSTRACT

A latch ram including on a single chip a memory array, an address latch and associated row and column decoders for addressing particular locations within the memory array, data I/O and associated column I/O circuitry for inputting data to and outputting data from the memory array, and microprocessor-controlled logic for controlling the input and output of such data. The device is packaged in a 28-pin DIP or SO package.

12 Claims, 6 Drawing Sheets

READ CYCLE 1 (ADDRESS ACCESS TIME - NON-PIPELINED)

READ CYCLE 2 (CHIP ENABLE AND OUTPUT ENABLE ACCESS)

READ CYCLE # (PIPELINED)

8 BIT BUS, 32Kx8 LATCH RAM APPLICATION

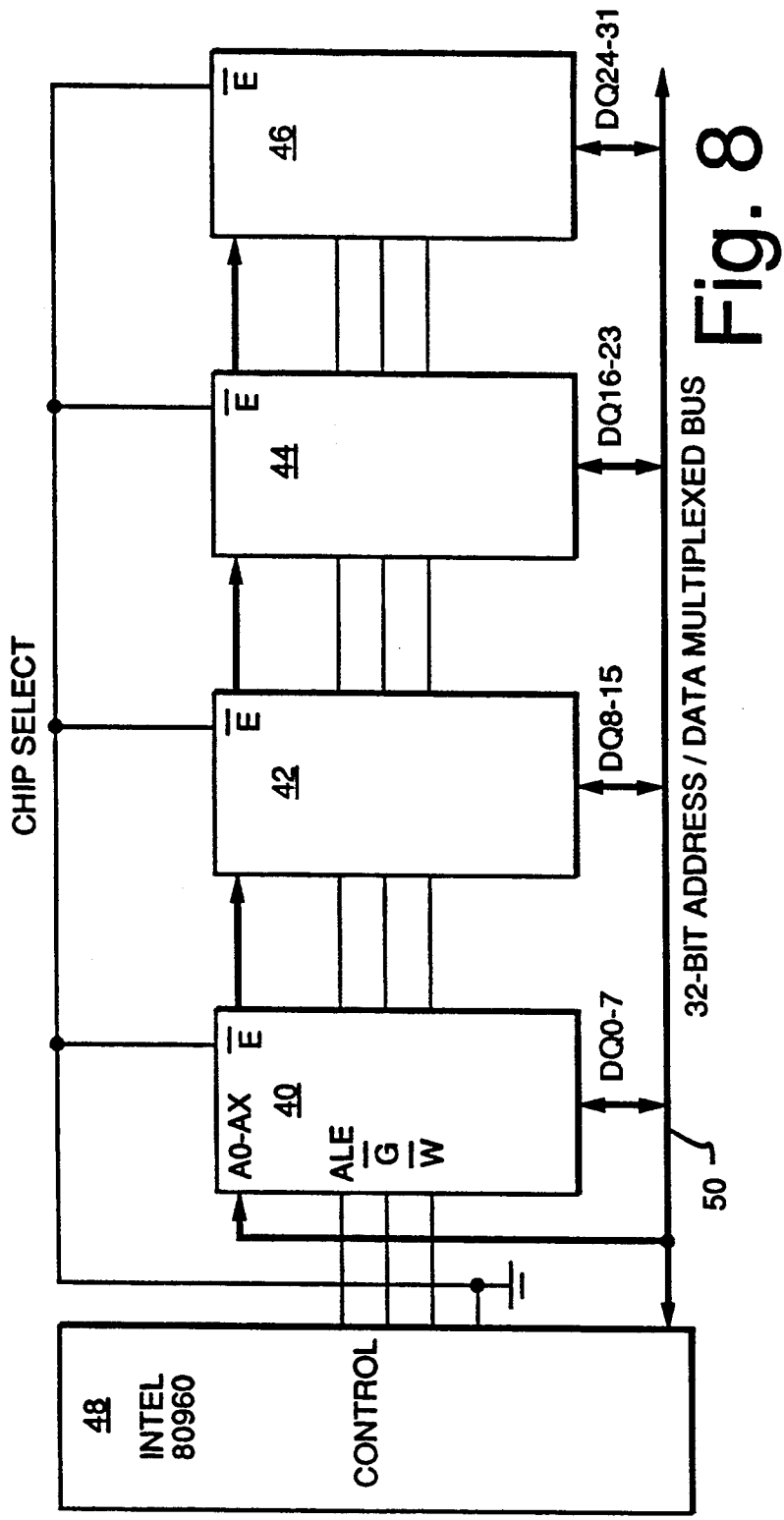

SRAM WITH TRANSPARENT ADDRESS LATCH AND UNLATCHED CHIP ENABLE

BACKGROUND OF THE INVENTION

1. Field of the Invention

The present invention relates generally to memory devices used in computerized control systems and more particularly to an improved static random access memory device (SRAM) having on-chip latches and associated control logic operative to save space and power and reduce component count and manufacturing cost in typical applications.

2. Description of the Prior Art

The decade of the eighties marked the beginning of rapid growth of microprocessors and microcontrollers for real-time embedded control applications. This trend is expected to continue during the 1990's as new integrated circuit components with higher performance and functionality will drive new applications. Advances in microcontroller architecture and process technology have precipitated highly integrated single-chip controllers with larger on-chip storage capacity and more I/O functions. In the midst of this explosive technological change one fact remains constant: the requirements for off-chip memory as program storage and data buffering continues to play a significant role. In most cases, traditional off-chip storage has been mostly used for control programs such as, for example, a set of control instructions for accomplishing a particular task. As such, EPROM (or OTP or ROM) devices are convenient and cost-effective devices to utilize. However, as new applications demand more intelligence and flexibility, read-modify-write operations are becoming an integral part of the entire application. Low-cost static random access memory (SRAM) is an optimum choice to complement and supplement the EPROM or OTP in new control environments. SRAM offers much more flexibility in that it allows stored information to be changed on-line, be it data or program instructions. Furthermore, as the clock frequency of microcontrollers forges toward 15 MHz to 25 MHz, SRAM appears to be the only viable and economical alternative for these cost-sensitive applications.

High-volume embedded control applications, such as intelligent hard-disk, tape and printer applications, continually require reductions in space and cost. By definition, the controller in an embedded control application is physically integrated or embedded inside the mechanism which it is controlling. More often than not, the circuit board space is at a premium. This condition puts great pressure on the system's designers who in turn must look to the semiconductor manufacturers for assistance with solutions that meet the stringent need of absolute minimum chip count, surface-mount packaging, and extremely low power consumption.

SUMMARY OF THE PRESENT INVENTION

It is therefore an object of the present invention to provide an improved SRAM device having features which accommodate high-speed read and write operations.

Another object of the present invention is to provide an improved SRAM of the type described which allows controller hardware to take on new roles in that many different control programs can be run simply by loading the SRAM on-line with the appropriate control software.

Another object of the present invention is to provide an improved SRAM, the use of which will result in cost savings and convenience.

Another object of the present invention is to provide an improved SRAM which will have an access speed sufficient to support microcontrollers with clock frequencies in excess of 15 MHz.

Briefly, a preferred embodiment of the present invention includes on a single chip a memory array, an address latch and associated row and column decoders for addressing particular locations within the memory array, data I/O and associated column I/O circuitry for inputting data to and outputting data from the memory array, and microprocessor-controlled logic for controlling the input and output of such data.

Among the advantages of the present invention is that it provides a single device which can be used to replace several microcontroller memory components normally used in embedded control applications.

Another advantage of the present invention is that it saves up to two external octal latch chips normally needed to hold the address information obtained from a microcontroller.

Yet another advantage of the present invention is that is provides a device which will supplement and complement the microcontroller's extended or external memory features.

These and other objects and advantages of the present invention will no doubt become apparent to those skilled in the art after having read the following detailed description of the preferred embodiment illustrated in the several figures of the drawing.

IN THE DRAWING

DETAILED DESCRIPTION OF THE PREFERRED EMBODIMENT

Figure 1:
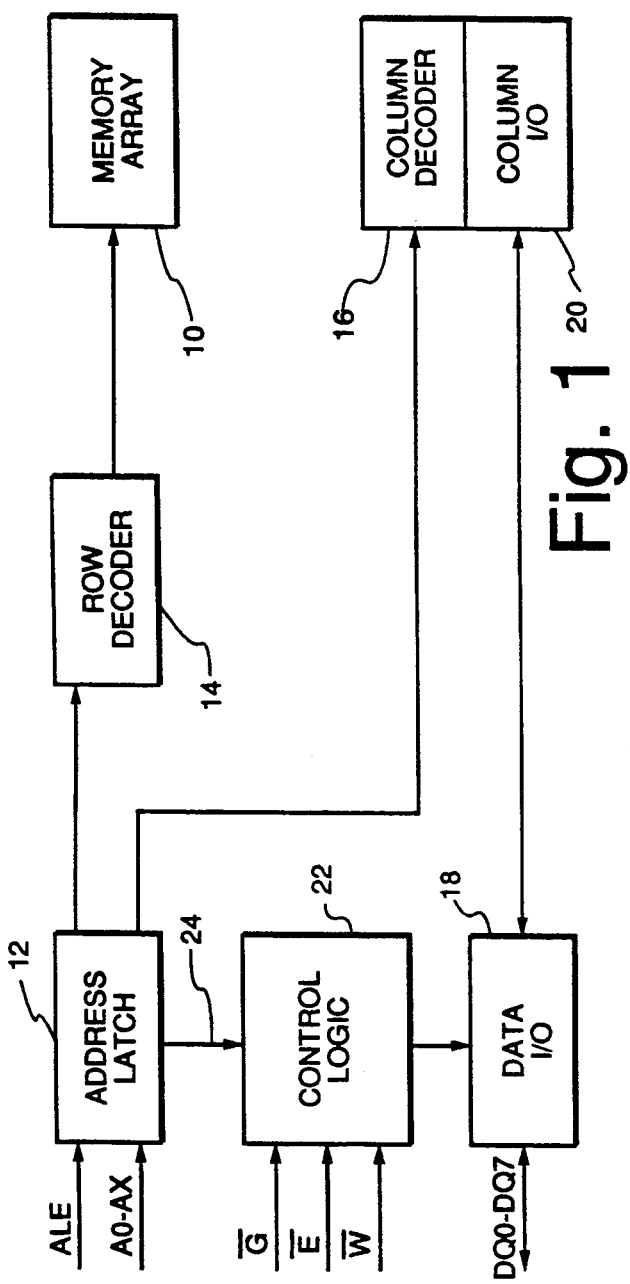
FIG. 1 is a block diagram illustrating the principal functional components of the present invention.

Referring now to FIG. 1 of the drawing, a latched SRAM in accordance with the present invention is shown in block diagram form to include a memory array 10, an address latch 12 and associated row decoder 14 and column decoder 16. The circuit also includes data I/O and column I/O circuits 18 and 20, respectively, for facilitating the input and output of data to and from memory locations addressed by or through address latch 12, and control logic 22 for controlling the input and output of such data.

Memory array 10 is typically a 12K by 8 or 16K by 8 random access memory containing a predetermined number of 8-bit word storage locations addressable via a corresponding number of address inputs $A_0$–$A_x$ to latch 12. The inputs are decoded by the row decoder 14 and column decoder 16. Latch 12 responds to an address latch enable (ALE) input which controls the internal transparent latches on the pins $A_0$–$A_x$ when ALE is HIGH, the latch is transparent, and the inputs on the address pins are applied to the memory array 10. On the falling edge of ALE the current input states of pin $A_0$–$A_x$ are latched and remain applied to the memory array 10 until ALE returns to the HIGH state.

Data I/O 18 includes eight bi-directional data input/output ports that are used to read data from or write data into the memory array 10. Control logic 22 responds to an output enable input $\overline{G}$, a chip enable $\overline{E}$, and a write enable input $\overline{W}$ to control operation of the data I/O ports 18. The output enable input $\overline{G}$ is active LOW. If the $\overline{G}$ input is active and the $\overline{W}$ input is inactive, data will be present on the DQ pins and they will be enabled. The DQ pins will be in the HIGH impedance state when $\overline{G}$ is inactive.

The chip enable input is active LOW. The chip enable must be active to read from or write to the device. If $\overline{E}$ is not active, the device is deselected and is in a stand-by power mode. The DQ pins will be in the HIGH impedance state when the device is deselected.

The write enable input $\overline{W}$ is active LOW and controls read and write operations. When $\overline{W}$ is HIGH and $\overline{G}$ is LOW, output data will be present at the DQ pins. When $\overline{W}$ is LOW, the data present on the DQ pins will be written into the selected memory location.

Control logic 22 also responds to an input at line 24 to inhibit input or output in the event an address outside the range of memory array 10 is asserted on lines $A_0$–$A_x$.

Figure 2:
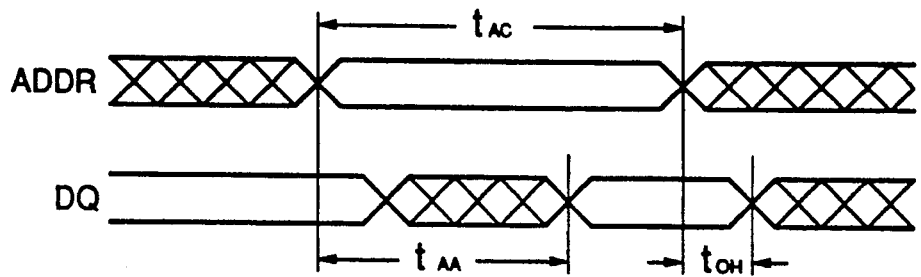
FIGS. 2 through 5 are timing diagrams illustrating operation of the present invention.

Referring now to FIG. 2 of the drawing, a timing diagram for a read cycle is illustrated and depicts non-pipelined address access time $t_{AA}$ as a portion of the read cycle time $t_{ac}$. $t_{OH}$ is the output hold time from address change. $\overline{W}$ is HIGH during all read cycles. The output is continuously enabled and ALE must be held HIGH during non-pipelined cycles. The crossed portions of the waveforms indicate that the input conditions are "don't care—any change permitted" and the outputs are "changing state unknown".

Figure 3:
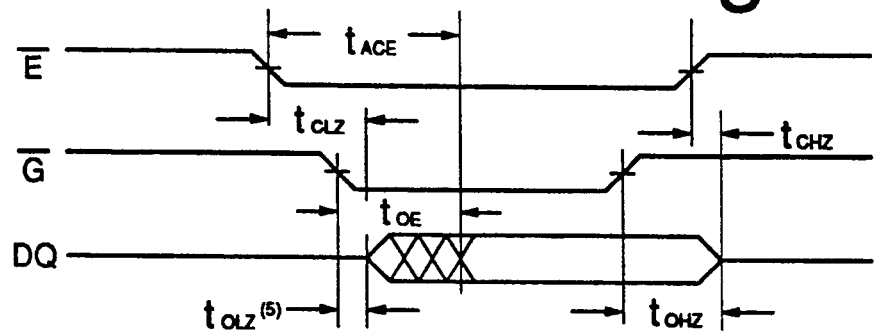

In FIG. 3 a second read cycle is illustrated depicting chip enable and output enable access. $t_{ACE}$ represents the chip enable access time; $t_{CLZ}$ illustrates chip enable to output in LOW impedance mode; $t_{CHZ}$ represents chip disenable to output in HIGH impedance; $t_{OE}$ indicates output enable to output valid; $t_{OLZ}$ signifies output enable to output in LOW Z; and $t_{OHZ}$ represents output disable to output in HIGH Z. During this cycle, $\overline{W}$ must be HIGH and the address must be valid sufficiently before $\overline{G}$ transition LOW to insure that the address access specification is not violated.

Figure 4:
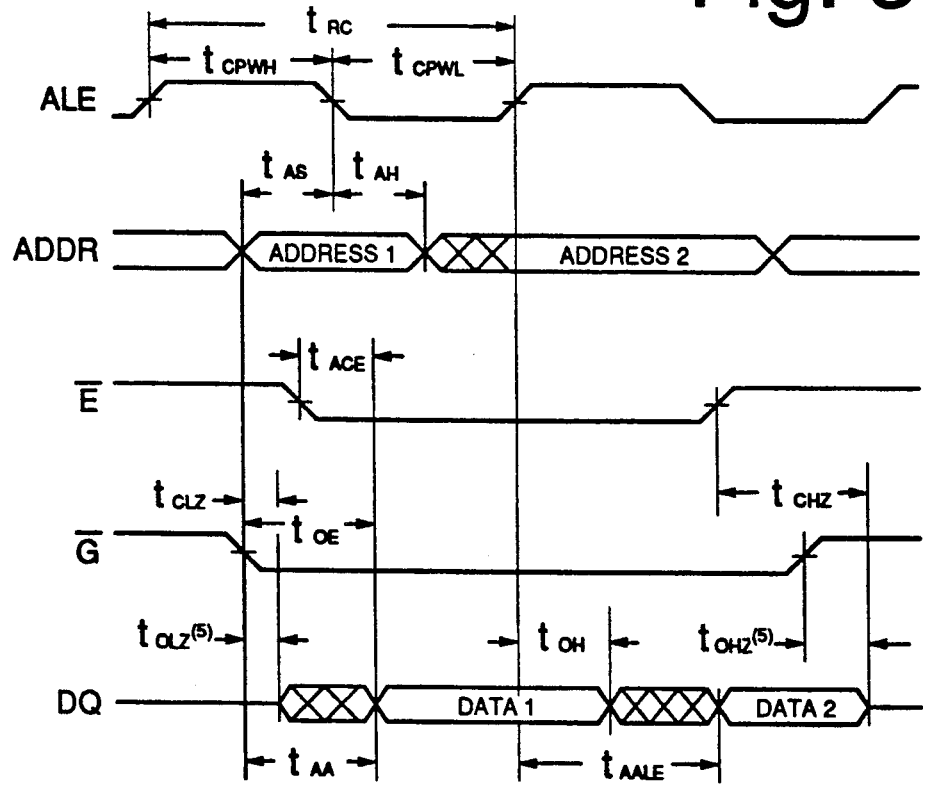

A third type of read cycle is illustrated in FIG. 4. In this example, $t_{CPWH}$ and $t_{CPWL}$ respectively represent ALE width HIGH and LOW respectively; $t_{AS}$ represents the address latch setup time; $t_{AH}$ signifies the address latch hold time; $t_{CLZ}$ indicates the chip enable to output in LOW impedance; $t_{OE}$ indicates output enable to output valid; $t_{AALE}$ indicates access time from ALE.

Figure 5:
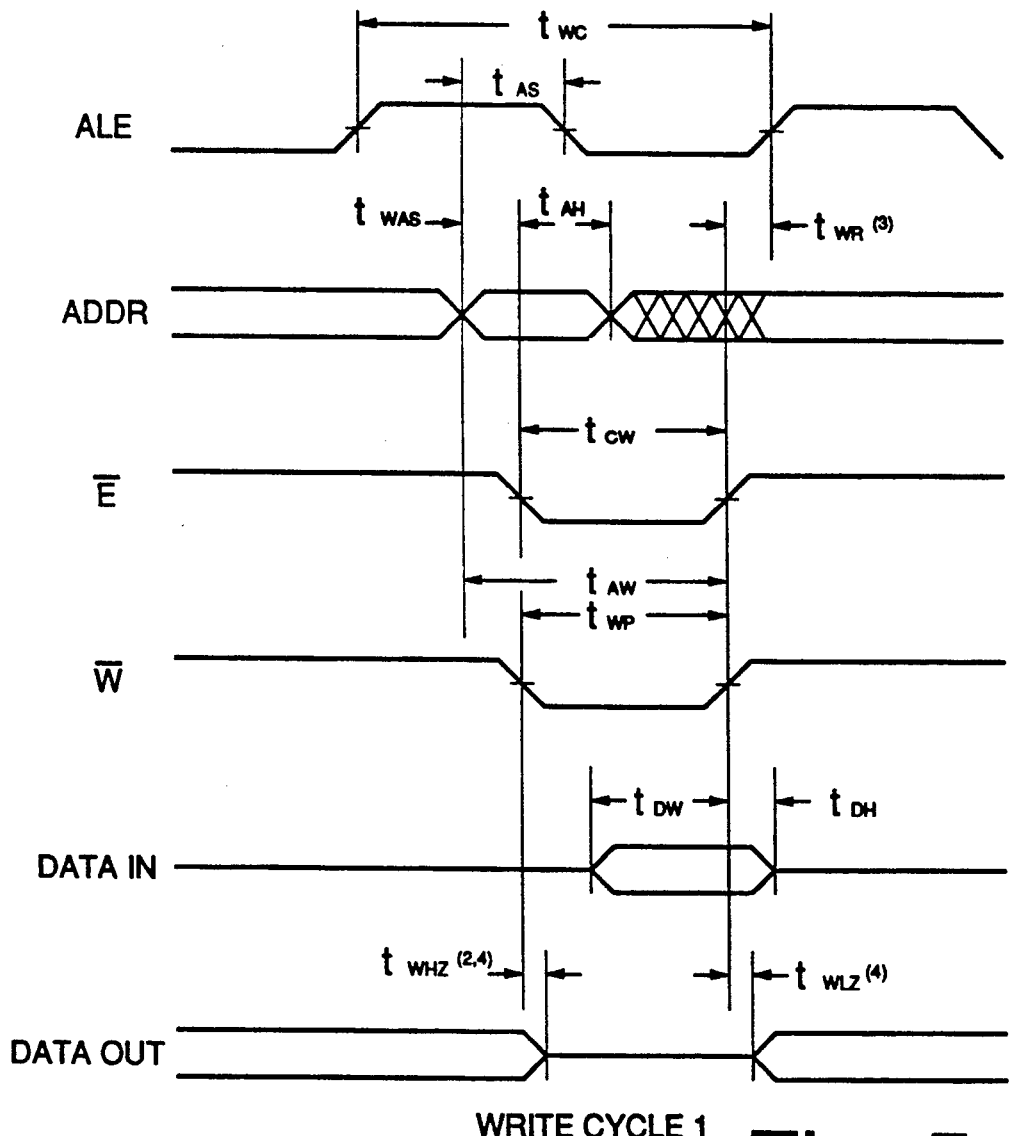

In FIG. 5 the switching waveforms during a write cycle are illustrated. $t_{WC}$ signifies the write cycle time; $t_{AS}$ is the address latch setup time; $t_{WAS}$ is the address to write setup time; $t_{AH}$ is the address latch hold time; $t_{WR}$ is the write recovery time; $t_{CW}$ is the chip enable to end of write time; $t_{AW}$ is the address valid to end of write time; $t_{WP}$ is the write pulse width time; $t_{DW}$ is the data valid to end of write time; $t_{DH}$ is the data hold to write time; $t_{WHZ}$ is the write to output in HIGH impedance; and $t_{WLZ}$ is the write to output in LOW Z. $\overline{W}$ must be HIGH during all address transitions. In all of the above waveforms, the crosses xxx have the same meaning.

Figure 1A:
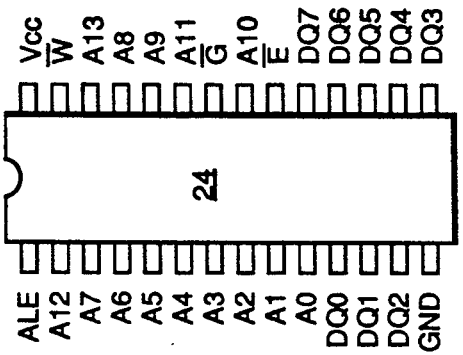

The present invention in its preferred form is a CMOS static RAM optimized for use with high-speed microcontrollers with multiplex addresses. The INTEL 8051 is one example. As indicated above, the device memory is organized to include a predetermined number of 8-bit words and contains on-chip transparent address latches to retain memory address information. In many applications, one such device can replace a combination of SRAMs and an octal latch. This configuration offers a significant density and cost advantage over a discrete implementation. The preferred embodiment is manufactured using high-performance CMOS technology and operates from a single 5-volt power supply. All inputs and outputs are TTL compatible, and the device is normally packaged in a space-saving 28 pin 300-mil dual in-line pin-out (DIP) package or a standard 330-mil slim-outline (SO-DIP) package. The preferred pin-out and 28-pin package configuration is depicted at 24 in FIG. 1A.

The present invention has particular applicability to 8-bit, 16-bit, and 32-bit embedded control applications which meet a diversity of needs. Acknowledging the importance of wider word organization, byte-wide word size is implemented, and in order to provide a logical migration path to meet requirements from low end to high end applications, storage capacities from 12K, 16K and 32K words (8-bit words) have been implemented. Microcontrollers with ROM-less option and those with external memory expansion capability can now take full advantage of these low-cost latched SRAMs.

As illustrated in the several figures of the drawing, the address latch is controlled by the address latch enable ALE which is an active HIGH input. When ALE is in a HIGH state, the latch is transparent, meaning that any addresses output by the microprocessor and input on the address bus $A_0$–$A_x$ will access directly to the memory array 10. On the falling edge of ALE the input address bus $A_0$–$A_x$ is latched and will continue to access the memory array as long as ALE remains in a logical low state. The output enable $\overline{G}$ is an active LOW input. When $\overline{G}$ is low and the $\overline{W}$ input is inactive, i.e. in a HIGH state, data from the memory array 10 will be presented on the $DQ_0$–$DQ_7$ bus as output. This is a memory read operation. When $\overline{G}$ is high or inactive, pins $DQ_0$–$DQ_7$ will be forced to a HIGH impedance state making "busing" simple.

The chip enable input $\overline{E}$ is an active LOW input. To read or write to memory, $\overline{E}$ must be held LOW. When $\overline{E}$ is HIGH, the chip is deselected. As such, the chip will be in a power down mode, and the $DQ_0$–$DQ_7$ bus will be forced to a HIGH impedance state. During the power down mode, the chip will dissipate only 3 mA (max) or 0.2 mA (typical).

The write enable input $\overline{W}$ is an active LOW input. Together with $\overline{G}$, the two control the read and write to memory. When $\overline{W}$ is HIGH and $\overline{G}$ is LOW, the read data will be presented on the $DQ_0$–$DQ_7$ bus as output. When $\overline{W}$ is LOW and $\overline{G}$ is in a "don't care" state, data on the $DQ_0$–$DQ_7$ bus will be written to the selected memory location.

Figure 6:
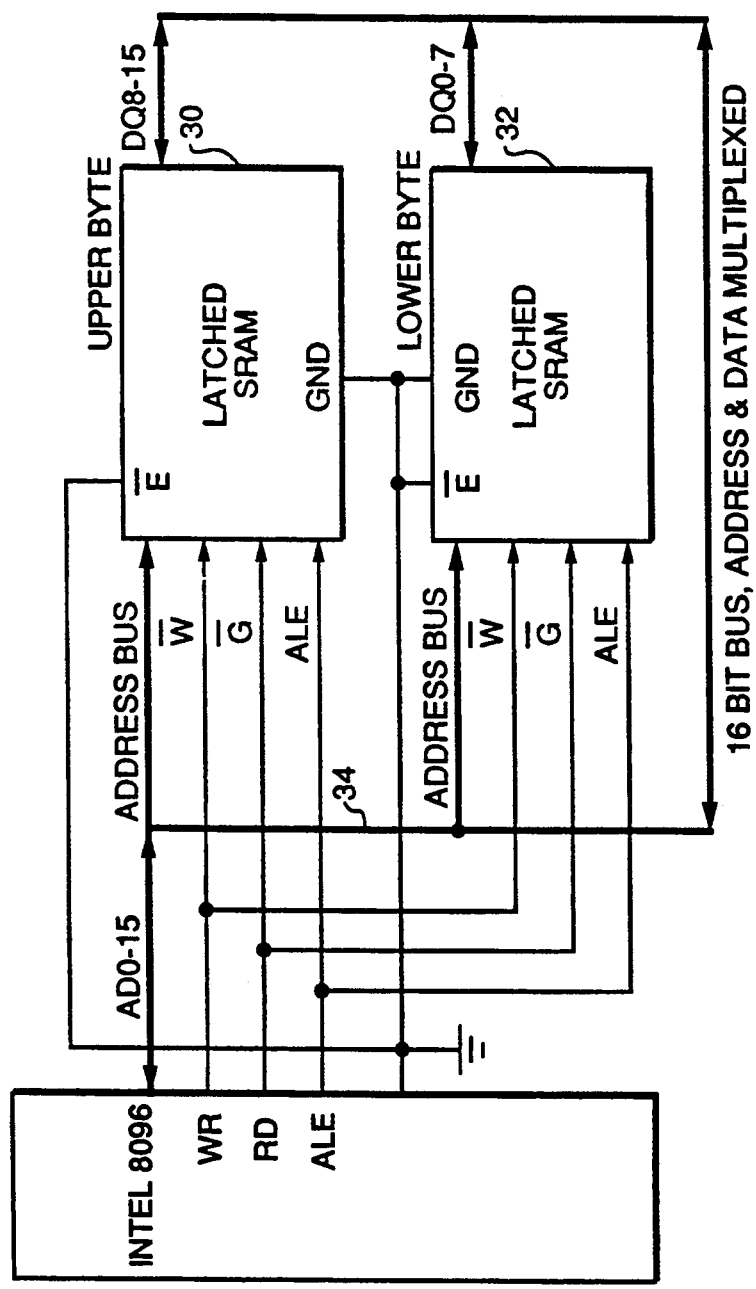
FIGS. 6 and 7 are examples of applications utilizing the present invention.

The variety of embedded control applications are virtually endless. In FIG. 6 two latched SRAM devices in accordance with the present invention are shown at 30 and 32 interfacing to an INTEL 8096 16-bit microcontroller. In this embodiment, the address and data are multiplexed over the same bus 34, and the upper 8-bit bytes of the 16-bit words are stored in the memory of the device 30 while the lower 8-bit bytes of the 16-bit words are contained in the device 32. Note that the devices are operated in parallel by read (RD), write (WR) and latch enable (ALZ) controls asserted on the $\overline{G}$, $\overline{W}$, and ALE inputs respectively. For non-depth expansion applications the chip enable inputs $\overline{E}$ are tied to GND (or $V_{SS}$) to enable the chips.

Figure 7:
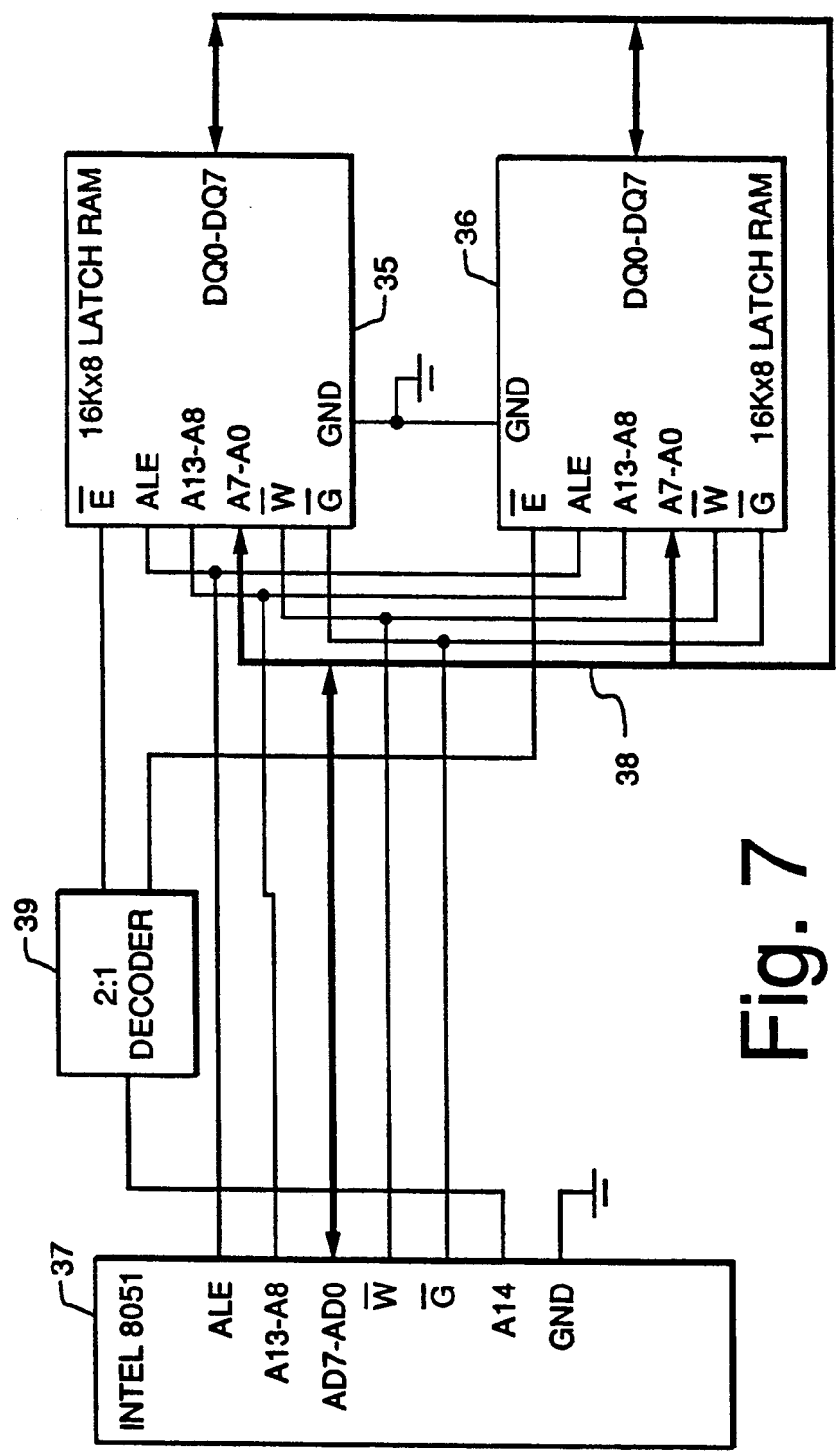

In FIG. 7, two latched 16K×8 SRAM devices 35 and 36 are operated in depth expansion mode by an INTEL 8051, 8-bit microcontroller 37. Both address information and data are handled by a single 8-bit multiplexed bus 38, and the chip select is accomplished by a decoder 39 which uses the highest order address bit to decode chip enable signals for application of the $\overline{E}$ inputs of the two latched SRAM devices 35 and 36.

In FIG. 8, four latched SRAM devices 40, 42, 44 and 46 are operated in parallel in a non-depth expansion mode by an INTEL 80960 in a fashion similar to that shown in FIG. 6 except that each device stores one 8-bit byte of each 32-bit word used by the 32-bit RISC processor 48. Both address information and data are handled by a single 32-bit multiplexed bus 50. As in FIG. 6, the chip select inputs $\overline{E}$ are tied to GND to enable the chips.

If a similar set of devices were to be operated in a depth expansion mode, a 4-to-1 decoder driven by the higher order address bits would be used to decode chip enable signals for application to the $\overline{E}$ inputs of the several latched RAM devices.

Typical applications of the present invention will be made in the microcontrollers of consumer products such as facsimile devices, copiers, modems, etc.; computer peripherals such as printers, disk drives, tape drives; avionics; industrial automation; instrumentation; telecommunications; and automotive operations. The present invention is fully compatible to industry's most popular microcontrollers, whether they are 8-bit, 16-bit or the latest 32-bit and 64-bit (RISC) varieties.

For those microcontrollers that have multiplexed data and address bus structure, the on-chip address latch of the device is particularly useful in that it saves up to two external octal latch chips which are normally needed to hold the address from the microcontroller. When high-density memory is used, the device can further help shrink chip count by its large storage capacity. As a result of its simple interface, the subject invention will supplement and complement the microcontroller's extended (or external) memory features. Since most applications require external storage to boost performance and flexibility, a large number of the state-of-the-art microcontrollers can take full advantage of the present invention.

Although the present invention has been described above in terms of a single preferred embodiment, it will be appreciated that various alterations and modifications thereof may become apparent to those of ordinary skill in the art. It is therefore intended that the appended claims cover all such alterations and modifications as fall within the true spirit and scope of the invention.

What is claimed is:

1. A single chip address latched SRAM device comprising:
    a memory array organized to store data in a word format with each word containing a predetermined number of data bits;
    address latch means having a plurality of input address lines and a plurality of output lines and operative to latch row address and column address inputs addressing particular locations in said memory array, and an address latch enable (ALE) input line, said address latch means being functionally transparent when an ALE input signal of a first logic state is applied to said ALE input line, said address latch means being operative to latch said output lines when an ALE input signal of a second logic state is applied to said ALE input line;
    data input/output means having a plurality of data input/output lines and a control input, said data input/output means being operative to selectively couple said plurality of data input/output lines to said memory array, and responsive to a control signal applied to said control input to determine when data is to be input thereto or output therefrom; and
    control logic means having at least three unlatched chip input lines for respectively receiving an output enable signal ($\overline{G}$), a chip enable signal ($\overline{E}$) and a write enable signal ($\overline{W}$), said control logic means being directly responsive to the three enable signals $\overline{G}$, $\overline{E}$ and $\overline{W}$, and operative to develop said control signal for controlling said data I/O means such that when $\overline{G}$ is of one state and $\overline{W}$ is of one state, data from said memory array will be output to said input/output lines, and when $\overline{W}$ is of a second state and $\overline{G}$ is of a second state, data present on said input/output lines will be written into an addressed memory location, and wherein when $\overline{E}$ is of a first logic state, said memory array is selected, and when $\overline{E}$ is of a second logic state, said memory array is deselected.

2. A single chip latched SRAM device as recited in claim 1 and further comprising:
    row decoder means and column decoder means associated with respective ones of said input address lines and operative to individually address selected word storage sites within said memory array.

3. A single chip latched SRAM device as recited in claim 2 and further comprising:
    column input/output means associated with said column decoder means and said data input/output means and operative to couple an addressed memory site to said input/output lines.

4. A single chip latched SRAM device as recited in claims 1-3 wherein said device is packaged in a 28-pin dual in-line pin-out package.

5. In a microcontroller including a microprocessor and one or more memory devices for storing processing data, an improved random access memory means embodied in one or more single chip integrated circuit devices each comprising:
    a memory array organized to store data in a word format with each word containing a predetermined number of data bits;
    address latch means having a plurality of input address lines and a plurality of output lines and operative to latch row address and column address inputs addressing particular locations in said memory array, and an address latch enable (ALE) input line, said address latch means being functionally transparent when an ALE input signal of a first logic state is applied to said ALE input line, said address latch means being operative to latch said output lines when an ALE input signal of a second logic state is applied to said ALE input line;
    data input/output means having a plurality of data input/output lines and a control input, said data input/output means being operative to selectively couple said plurality of data input/output lines to said memory array, and responsive to a control signal applied to said control input to determine when data is to be input thereto or output therefrom; and control logic means having at least three unlatched chip input lines for respectively receiving an output enable signal ($\overline{G}$), a chip enable signal ($\overline{E}$) and a write enable signal ($\overline{W}$), said control logic means being directly responsive to the three enable signals $\overline{G}$, $\overline{E}$ and $\overline{W}$, and operative to develop said control signal for controlling said data I/O means such that when $\overline{G}$ is of one state and $\overline{W}$ is of one state, data from said memory array will be output to said input/output lines, and when $\overline{W}$ is of a second state and $\overline{G}$ is of a second state, data present on said input/output lines will be written into an addressed memory location, and wherein when $\overline{E}$ is of a first logic state, said memory array is selected, and when $\overline{E}$ is of a second logic state, said memory array is deselected.

6. In a microcontroller as recited in claim 5 and further comprising:

row decoder means and column decoder means associated with respective ones of said input address lines and operative to individually address selected word storage sites within each said memory array.

7. In a microcontroller as recited in claim 6 and further comprising:

column input/output means associated with said column decoder means and said data input/output means and operative to couple an addressed memory site to said input/output lines.

8. In a microcontroller as recited in claim 5, 6 or 7, wherein said integrated circuit devices are packaged in 28-pin dual in-line pin-out (DIP) packages.

9. In a microcontroller as recited in claim 8 and further including chip select decoder means driven by high order address signals generated by said microprocessor and operative to develop said chip enable signals.

10. In a microcontroller as recited in claim 8 wherein the chip enable signal inputs of all of said integrated circuit devices are connected in common.

11. A single chip latched SRAM device as recited in claim 1 and further comprising:

input/output control means for sensing when an address is too large for said address latch means and in response disabling said control logic means.

12. A single chip latched SRAM device as recited in claim 5 and further comprising:

input/output control means for sensing when an address is too large for said address latch means and in response disabling said control logic means.

* * * * *